United States Patent
Kao et al.

(10) Patent No.: US 7,653,151 B2
(45) Date of Patent: Jan. 26, 2010

(54) COMMUNICATION SYSTEM WITH DEMODULATION OF TWO-LEVEL DIFFERENTIAL AMPLITUDE-SHIFT-KEYING SIGNALS

(75) Inventors: Chih-Yang Kao, Jhongli (TW); Ching-Yung Chen, Kaohsiung (TW); Yung-Hua Hung, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 543 days.

(21) Appl. No.: 11/321,858

(22) Filed: Dec. 28, 2005

(65) Prior Publication Data

US 2007/0076820 A1 Apr. 5, 2007

(30) Foreign Application Priority Data

Oct. 3, 2005 (TW) .............................. 94134468 A

(51) Int. Cl.
*H03D 3/22* (2006.01)
(52) U.S. Cl. ...................................... 375/330
(58) Field of Classification Search ................ 375/320, 375/322, 286, 287, 353, 330, 283, 308
See application file for complete search history.

(56) References Cited

U.S. PATENT DOCUMENTS

| | | | |
|---|---|---|---|
| 5,818,875 A * | 10/1998 | Suzuki et al. ................ | 375/261 |
| 5,949,796 A | 9/1999 | Kumar ........................ | 370/529 |
| 6,046,629 A * | 4/2000 | Akiyama et al. ............ | 329/304 |
| 6,148,007 A | 11/2000 | Kroeger ....................... | 370/480 |
| 6,192,068 B1 | 2/2001 | Fattouche et al. ............ | 375/130 |
| 6,246,698 B1 | 6/2001 | Kumar ......................... | 370/487 |
| 6,320,897 B1 | 11/2001 | Fattouche et al. ............ | 375/130 |
| 6,480,233 B1 * | 11/2002 | Limberg ...................... | 348/470 |
| 6,603,826 B1 | 8/2003 | Cupo et al. .................. | 375/346 |
| 6,618,352 B1 | 9/2003 | Shirakata et al. ............ | 370/203 |
| 6,686,879 B2 | 2/2004 | Shattil ......................... | 342/367 |
| 6,813,485 B2 | 11/2004 | Sorrells et al. .............. | 455/313 |
| 6,853,690 B1 | 2/2005 | Sorrells et al. .............. | 375/295 |
| 6,907,089 B2 | 6/2005 | Jensen et al. ................. | 375/324 |
| 7,173,979 B1 * | 2/2007 | Badri et al. .................. | 375/308 |
| 2004/0036647 A1 | 2/2004 | Lee | |
| 2005/0111590 A1 * | 5/2005 | Fang et al. ................... | 375/330 |
| 2006/0256892 A1 * | 11/2006 | Momtaz ....................... | 375/317 |

* cited by examiner

*Primary Examiner*—David C Payne
*Assistant Examiner*—Leon-Viet Q Nguyen
(74) *Attorney, Agent, or Firm*—J.C. Patents

(57) ABSTRACT

A structure and method for demodulating two-level differential amplitude-shift-keying signals using simple adding operations are provided. Threshold values are dynamically adjusted according to the channel response. By comparing the threshold values and the differential amplitude values, it can be found whether the amplitude of the received signal is changed. Furthermore, it no needs to know the changed value of received signal amplitudes and the differential two-level amplitude-shift-keying signals can be demodulated by just detecting whether the amplitude of the received signal is changed. By this idea, the complexity of the receiver implementation is simplified and the demodulator can get better performance.

13 Claims, 4 Drawing Sheets

COMMUNICATION SYSTEM WITH DEMODULATION OF TWO-LEVEL DIFFERENTIAL AMPLITUDE-SHIFT-KEYING SIGNALS

CROSS-REFERENCE TO RELATED APPLICATION

This application claims the priority benefit of Taiwan application serial no. 94134468, filed on Oct. 13, 2005. All disclosure of the Taiwan application is incorporated herein by reference.

BACKGROUND OF THE INVENTION

1. Field of the Invention

The present invention relates to a demodulating mechanism of a communication system. More particularly, the present invention relates to a demodulation mechanism utilizing two-level differential amplitude-shift-keying and a communication system using the same.

2. Description of the Related Art

In this modern world, communication techniques and communication systems play very important roles in daily life. Popular communicating systems include mobile phones and wired/wireless networks. In recent years, in the wire/wireless network and digital terrestrial broadcasting applications, orthogonal frequency division multiplexing (OFDM) transmission techniques based on multi-carrier modulation are useful in overcoming multi-path reflection effects. The multi-path reflection effects originate when, in digital communication or broadcasting application, information signals in the form of electromagnetic waves are transmitted from a transmitter through a physical channel (for example, air) to a receiver. Due to the non-ideal properties of the physical channel, multi-path reflection and attenuation occur so that the input signals are distorted.

According to the modulation technique applied, the OFDM system can be categorized as coherent OFDM systems and non-coherent OFDM systems. For coherent modulation at the receiver of the coherent OFDM system, the transmitter transmits pilot signals and information signals. The receiver performs channel estimation and equalization operation based on pilot signals and compensates for distortion due to channel effects. Popular coherent OFDM systems applying quadrature amplitude modulation (QAM) include: digital video broadcasting-terrestrial (DVB-T), asymmetric digital subscriber line (ADSL), very-high-speed digital subscriber line (VDSL) and wireless local area network (WLAN) 802.11a/g/n.

In the non-coherent OFDM system, the transmitter utilizes differential modulation to transmit the difference (the relative magnitude instead of the absolute magnitude) between neighboring transmitted signals. The receiver uses reverse differential demodulation techniques to recover the transmitted signal. The compensation for channel effect is already existed within the differential demodulation process. Non-coherent OFDM systems applying differential quadrature-phase-shift-keying (D-QPSK) include: digital audio broadcasting (DAB), home plug and integrated services digital broadcasting-terrestrial (ISDB-T).

The coherent OFDM system and the coherent OFDM system have drawbacks and merits. The non-coherent OFDM system has two major advantages: firstly, no frequency bandwidth sacrificed in transmitting the pilot signal at the transmitter; and, secondly, a simple receiver because no channel estimation and equalization are required. However, the non-coherent OFDM system also has its drawbacks. The non-coherent OFDM system has a worse theoretical demodulating performance than the coherent OFDM system.

The aforementioned non-coherent OFDM system uses the D-QPSK modulation technique. Hence, the corresponding demodulation just requires simple multiplication operations. Furthermore, using the differential phase-shift-keying (D-PSK) in the same bandwidth for increasing the number of phase bits increases the efficiency of the frequency spectrum in the non-coherent OFDM system. Although this method can still get aforementioned advantages, higher signal-to-noise ratio (SNR) will lead to significant drops in the operation efficiency of the system. Therefore, the differential amplitude—phase-keying (D-APSK) modulation technique has been developed for the non-coherent OFDM system to increase its spectrum efficiency. Nevertheless, the D-APSK modulation technique combines the differential phase-shift-keying (D-PSK) technique and the differential amplitude-shift-keying (D-ASK) technique together.

In the following the D-ASK signal modulation and related conventional techniques are described. The first conventional technique is disclosed in the U.S. patent application publication No. 2004/00366471, titled "Differential amplitude detection diversity receiver". The first conventional technique uses a divider to serve as a diverse antenna receiver for demodulating the received D-ASK signal.

In the first conventional demodulation technique, three devices, an absolute value unit, a delay unit and a divider unit, are used to demodulate the differential amplitude signal and the result is transmitted to an amplitude selection unit for evaluating the magnitude of the amplitude. Since the method of determining the differential amplitude requires a divider, the implementation is highly complicated.

The second conventional demodulation technique is disclosed in U.S. Pat. No. 5818875, titled "Modulation and demodulation method, modulator and demodulator". The second conventional technique uses a logarithmic-to-linear conversion to demodulate the D-ASK signals. In the second conventional technique, the amplitude of the input signals is transformed to logarithmic value so that the division operations with linear values are implemented by subtraction operations with logarithmic values. After obtaining a difference value in the logarithmic domain, it is converted back to a linear value in the linear domain so that a differential quantity is produced. This replacement method for division is more aptly applied to an analog circuit design. If implemented in digital, a look-up table is needed in the logarithmic/linear area conversion. Ultimately, the sophistication in hardware implementation is a problem.

The third conventional demodulation technique is disclosed in U.S. Pat. No. 6,148,007 titled "Method for data transmission in a digital audio broadcasting system". The D-ASK signals are demodulated according to the following schemes:

$$|R[n]| < |R[n-1]| * ((1+a/b)/2) \rightarrow u[n]=1,$$

$$|R[n]| > |R[n-1]| * ((1+b/a)/2) \rightarrow u[n]=1,$$

otherwise, $$u[n]=0.$$

In the aforementioned equations, $R[n]$ and $R[n]$ and $R[n-1]$ are transmitted from the transmitter, 'a' and 'b' represent the amplitude of the transmitted signal, and $u[n]$ is the amplitude bit determined by the receiver. In practice, if $|R[n-1]|$ on the right side of the inequality is moved to the left side, and then it is equivalent to a division.

The fourth conventional demodulation technique is disclosed in U.S. Pat. No. 6,046,629 titled "Method of an apparatus for demodulating amplitude-modulated signals in an amplitude-phase-shift-keying (APSK) system". The fourth conventional demodulation technique can be regarded as using the third conventional demodulation technique in a corresponding demodulation device. The threshold value acquisition circuit and the amplitude change decision circuit are major devices.

In the D-APSK demodulation technique, the D-PSK signal demodulation is simple while the D-ASK signal demodulation is sophisticated. The D-ASK signal demodulation is based on the concept of using divider. However, division circuits are more sophisticated. Moreover, demodulation based on division frequently leads to enhance noise effect in the demodulated signals and reduces the demodulation capacity. Hence, how to effectively demodulating D-ASK signals has become a critical point in designing the receiver of a communication system.

SUMMARY OF THE INVENTION

Accordingly, at least one aspect of the present invention is to provide a circuit and method of demodulating two-level D-APSK signal that uses only simple addition operations. By abstaining from division, the present invention not only simplifies the complexity in hardware implementation, but also improves the performance of the demodulator.

At least another aspect of the present invention is to provide a two-level D-APSK demodulation structure based on the combination of two-level differential amplitude and differential phase to maintain the differential demodulation technique while increasing system capacity and spectrum efficiency. In addition to circuit cost down, the present invention also provides a better receiver performance and increases the system capacity.

To achieve these and other advantages and in accordance with the purpose of the invention, as embodied and broadly described herein, one embodiment of the invention provides a two-level differential amplitude-shift-keying (D-ASK) signal demodulator for demodulating two-level differential amplitude-shift-keying signals. The demodulator includes: a first envelope detector for detecting the amplitude of an input signal and providing an amplitude signal for the input signal; a first delay unit for delaying the amplitude signal of the input signal and generating a delayed amplitude signal; a first subtractor for subtracting the delayed amplitude signal from the amplitude signal of the input signal; a second envelope detector for detecting the amplitude signal of the output signal from the first subtractor; a threshold value generator for receiving the amplitude signal of the input signal from the first envelope detector and dynamically generating a threshold value; and a comparator for comparing the output from the second envelope detector with the threshold value produced by the threshold value generator to determine if there is any change in the amplitude of continuous input signals and output a comparison result as an amplitude bit of the input signal.

Another embodiment of the present invention provides a method of demodulating two-level differential amplitude-shift-keying signals. The method includes the steps of: receiving and detecting the amplitude of an input signal to generate an amplitude signal; delaying the amplitude signal to generate a delayed amplitude signal; dynamically generating a threshold value according to the amplitude signal wherein the threshold value responds to a channel response; computing a difference value between the amplitude signal and the delayed amplitude signal; detecting an amplitude of the difference value; and comparing the difference value with the threshold value for determining an amplitude bit of the input signal based on the comparison result. Hence, through the difference in amplitude value between continuous input signals and the compared result of the threshold value, the amplitude bit of the input signal is determined.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
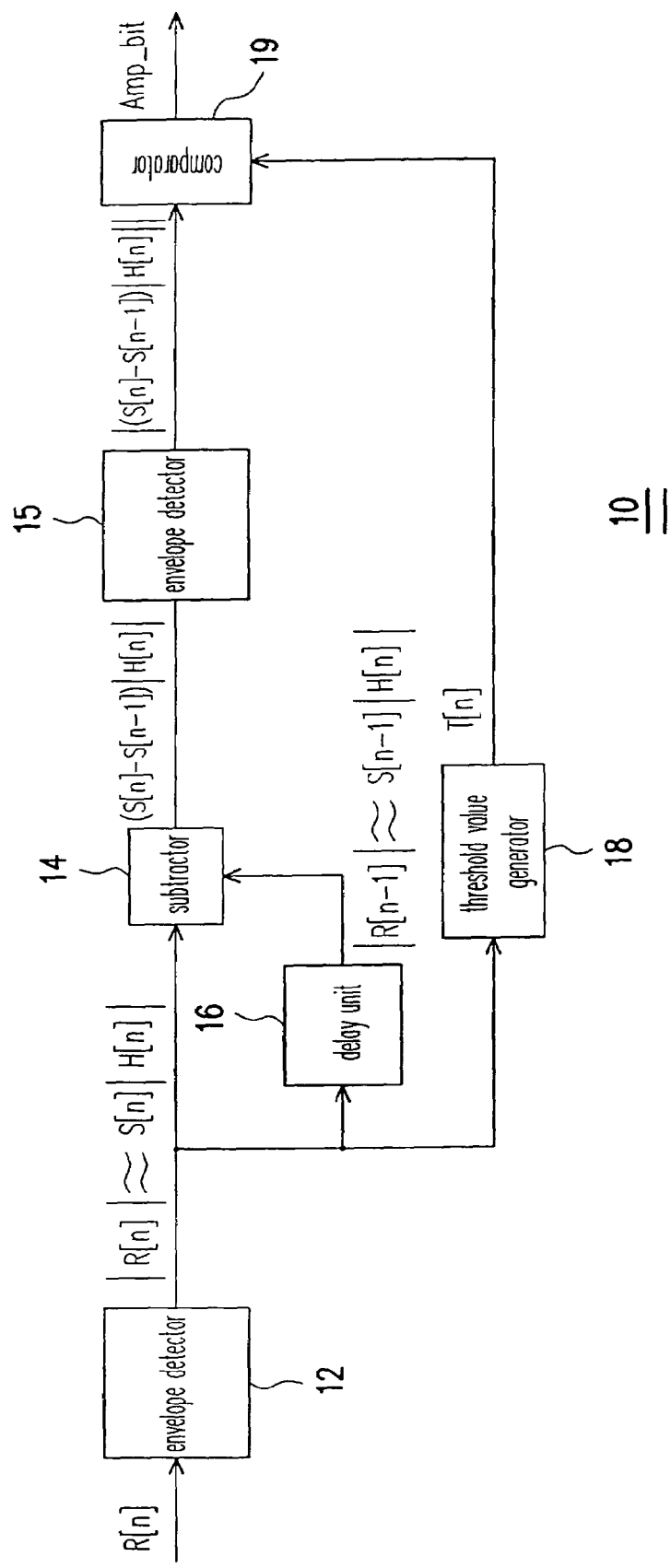
FIG. 1 is a block diagram showing a two-level differential amplitude detector according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

In "two-level" differential amplitude-shift-keying (D-ASK) signal demodulation, whether there is any change in the amplitude of the input signal is determined. There is no need to accurately detect amplitude change ratios. That is because the amplitude change ratio is useful in high-level (higher than 2-level) D-ASK signals. Accordingly, with respect to the "two-level" D-ASK signal, one embodiment of the present invention proposes a demodulator having lower cost and better performance. The demodulator includes simple adders/subtractors and a threshold value generator. The threshold value generator responds to any change in the channel effect and dynamically adjusts the threshold value. The threshold value is used to determine if there is any change in the amplitude of the input signal. Thus, the present invention can simplify the circuit design of the demodulator, avoid larger noise and obtaining better demodulation capability.

FIG. 1 is a block diagram showing a two-level differential amplitude detector according to one embodiment of the present invention. As shown in FIG. 1, a differential amplitude detector 10 includes an envelope detector 12, a subtractor 14, an envelope detector 15, a delay unit 16, a threshold value generator 18 and a comparator 19.

When an input signal R[n] is transmitted to the differential amplitude detector 10, the envelope detector 12 determines the amplitude $|R[n]|$ of the input signal R[n]. Here, it is assumed the channel effect in the communication system is H[n] and the channel strength is $|H[n]|$ is unknown because no channel estimation is performed in the present embodiment. The amplitude is expressed by: $|R[n]|=S[n]*|H[n]|+W[n]$, where $W[n]$ represents white noise, and $S[n]$ represents amplitude value. In general, $W[n]$ is ignored. In other words, the amplitude detected and output by the envelope detector 12 is $|R[n]| \approx S[n]*|H[n]|$.

The delay unit 16 is used for delayed the input signal $R[n]$ into another input signal $R[n-1]$. In other words, the delaying unit 16 is a latch for latching a previous input signal $R[n-1]$. According to the foregoing formula, $|R[n-1]| \approx S[n-1]*|H[n]|$.

The subtractor 14 subtracts the output of the delay unit 16 from the output of the envelope detector 12. In other words, the output of the subtractor 14 is $(S[n]-S[n-1])*|H[n]|$.

The envelope detector 15 receives the output from the subtractor 14 to generate an amplitude value thereof. In other words, the envelope detector 15 outputs the absolute value of the output signal from the subtractor 14.

The threshold generator 18 receives the amplitude detected by the envelope detector 12 to generate a threshold value $T[n]$.

Therefore, the threshold value $T[n]$ produced by the threshold value generator 18 and the output from the envelope detector 15 are input to the comparator 19. The comparator 19 detects any change in the amplitude between the consecutive input signals $R[n]$ and $R[n-1]$ for deciding the transmission signal or the amplitude bit amp_bit. If the output from the envelope detector 15 (a differential value) is greater than the threshold value $T[n]$, this implies the amplitude is changed and the amp_bit is '1'. On the other hand, if the differential value is smaller than the threshold value, then the amplitude remains and the amp_bit is '0'.

$|(S[n]-S[n-1])*|H[n]||>T[n]$, amp_bit=1

$|(S[n]-S[n-1])*|H[n]||<T[n]$, amp_bit=0.

The function of the threshold value generator 18 is as follows:

$T[0]=\alpha*|R[0]|$ $T[n]=(1-\mu)*T[n-1]+\mu*\alpha*|R[n]|$ where $\mu$ is a small constant (for example: $2^{-K}$, K is a positive integer) representing a step-size value, and $\alpha$ is a constant value. The threshold value generator 18 dynamically adjusts the required threshold value according to the input signal.

Assume the bits '0' and '1' of the transmitted signals appear equally, the best selection for $\alpha$ can be deduced as $\alpha=(b-a)/(a+b)$ where a and b represent two amplitude levels (with b>a).

It should be noted that the selection of $\alpha$ is off-line. Hence, the threshold value generator 18 is implemented by constant multiplication or even 2's power to approximate best $\alpha$. There is no need even to use a multiplication unit to implement the threshold value generator so that the circuit structure of the demodulator can be further simplified to reduce circuit implementation cost.

Figure 2:
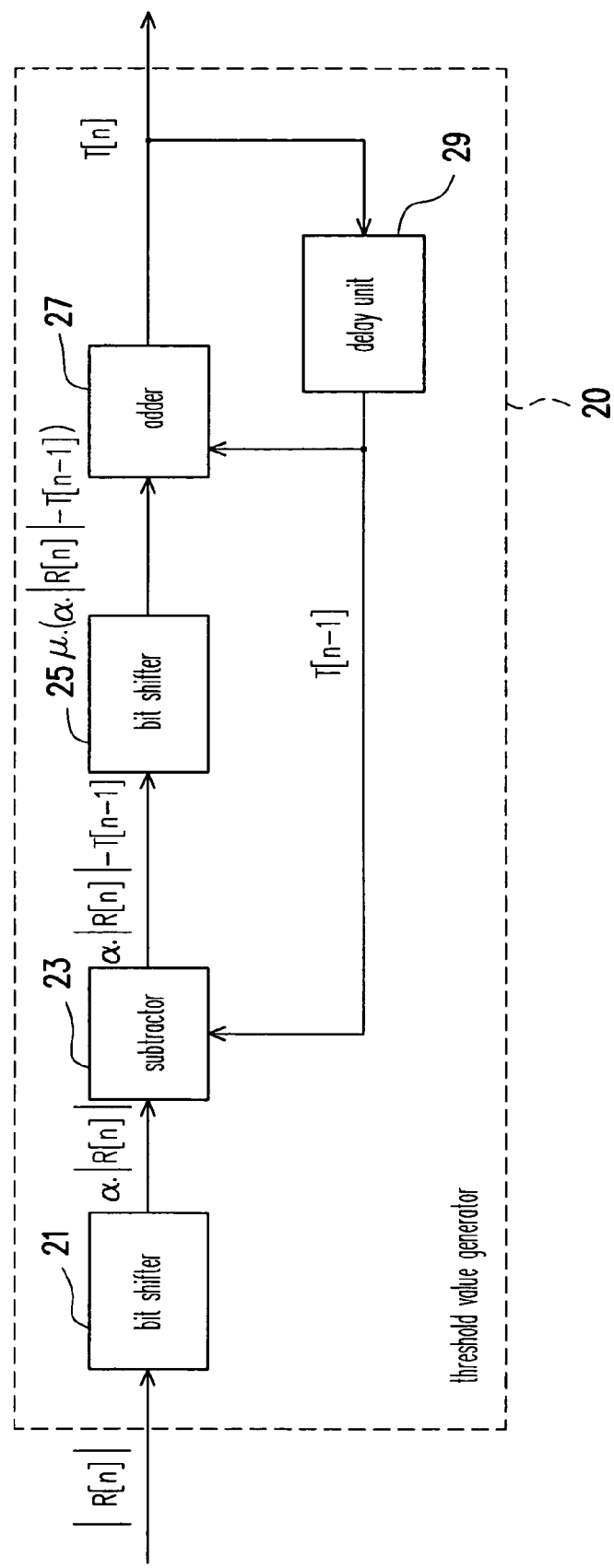
FIG. 2 is a block diagram showing a threshold value generator according to another embodiment of the present invention.

Basically, the structure of the threshold value generator 18 is not specially limited as long as the aforementioned function is provided. FIG. 2 is a block diagram showing a threshold value generator according to another preferred embodiment of the present invention. As shown in FIG. 2, the threshold value generator includes a bit shifter 21, a subtractor 23, a bit shifter 25, an adder 27 and a delay unit 29.

The bit shifter 21 shifts the amplitude $|R[n]|$ of the input signal. In mathematically, the output from the bit shifter 21 is $\alpha|R[n]|$ where $\alpha$ is defined above.

The subtractor 23 subtracts the ouptut $T[n-1]$ of the delay unit 29 from the output of the bit shifter 21. In mathematically, the output from the subtractor 23 is $(\alpha|R[n]|-T[n-1])$.

The bit shifter 25 shift the output from the subtractor 23. In mathematically, the output from the bit shifter 25 is $\mu*(\alpha|R[n]|-T[n-1])$ where $\mu$ is defined as above.

The adder 27 adds the output $T[n-1]$ of the delay unit 29 and the output of the bit shifter 25. In mathematically, the output from the adder 27 is $\mu*(\alpha|R[n]|-T[n-1])+T[n-1]$.

Finally, the output from the adder 27 is defined as $T[n]$. In other words, $T[n]=\mu*(\alpha|R[n]|-T[n-1])+T[n-1]$. Or equivalently, $T[n]=(1-\mu)*T[n-1]+\mu\alpha|R[n]|$.

Figure 4:
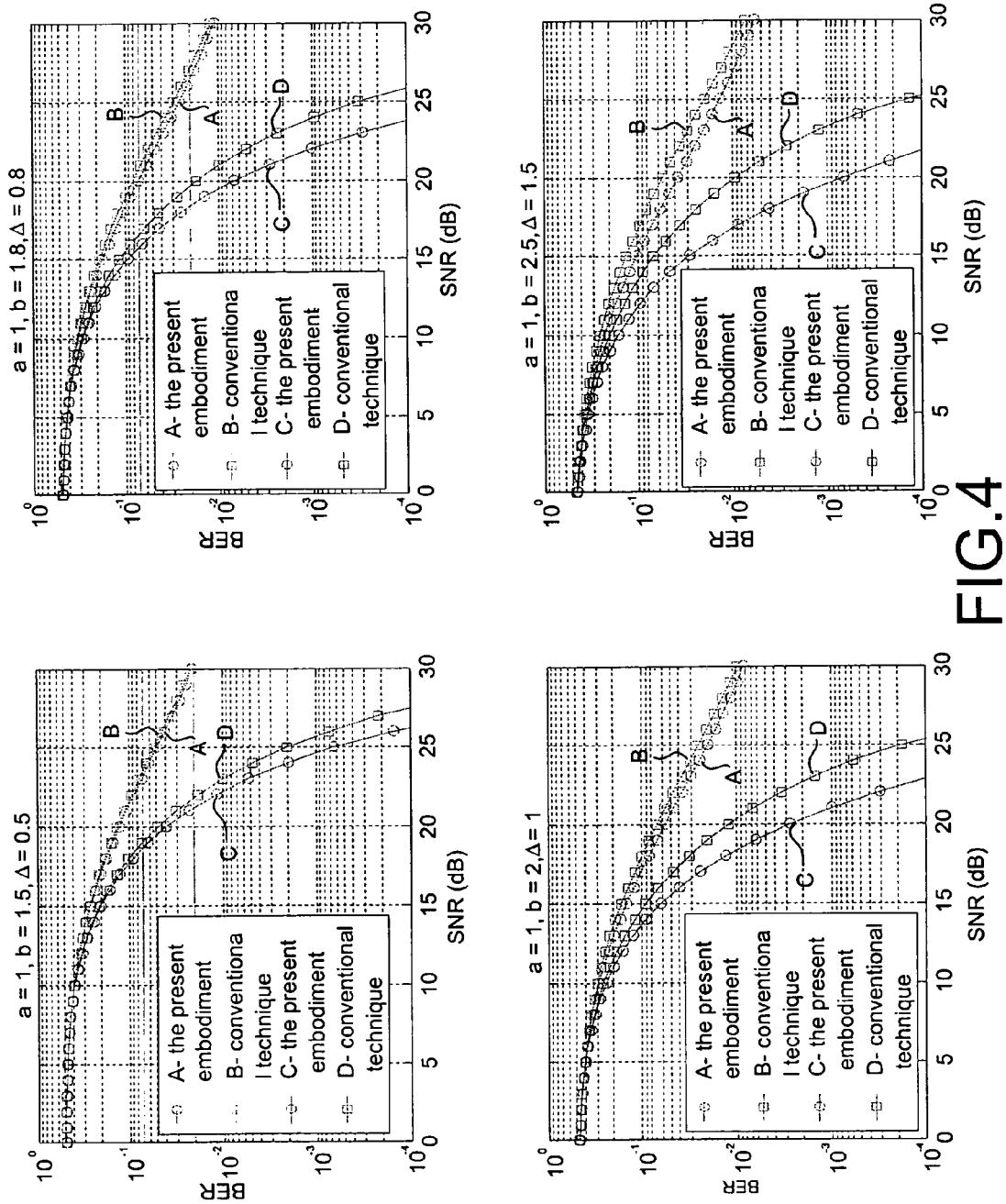
FIG. 4 shows comparison between simulation results of the conventional technique and embodiments according to the present invention.

FIG. 4 shows comparison between simulation results of the conventional technique (base on the division) and embodiments according to the present invention (based on the D-ASK signal demodulation method), where BER represents bit error rate. In FIG. 4, the sub-figures correspond to different 'a' and 'b' values. The curves A in various sub-figures are the simulated results of the present embodiment with due consideration of the Doppler effect. The curves B in various sub-figures are the simulated results of the conventional technique with due consideration of the Doppler effect. The curves C in various sub-figures are the simulated results of the present embodiment in a flat channel (without consideration of the Doppler effect). The curves D in various sub-figures are the simulated results of the conventional technique in a flat channel (without consideration of the Doppler effect). According to the simulation results, it can be observed that the embodiments of the present invention have better BER performance than the conventional technique. For example, there is approximately a 1~3 dB improvement when BER=0.01.

Furthermore, for increasing the spectrum efficiency of current non-coherent OFDM system, the D-APSK modulation technique with both amplitude and phase modulation is used to replace the D-QPSK modulation so that the capacity and the transmission rate of the D-QPSK is increased. In addition to add a phase bit to the D-QPSK constellation, another amplitude bit is also added. However, in order to maintain the differential demodulation function of a D-QPSK, the amplitude has to be demodulated using a differential demodulator.

Figure 3:
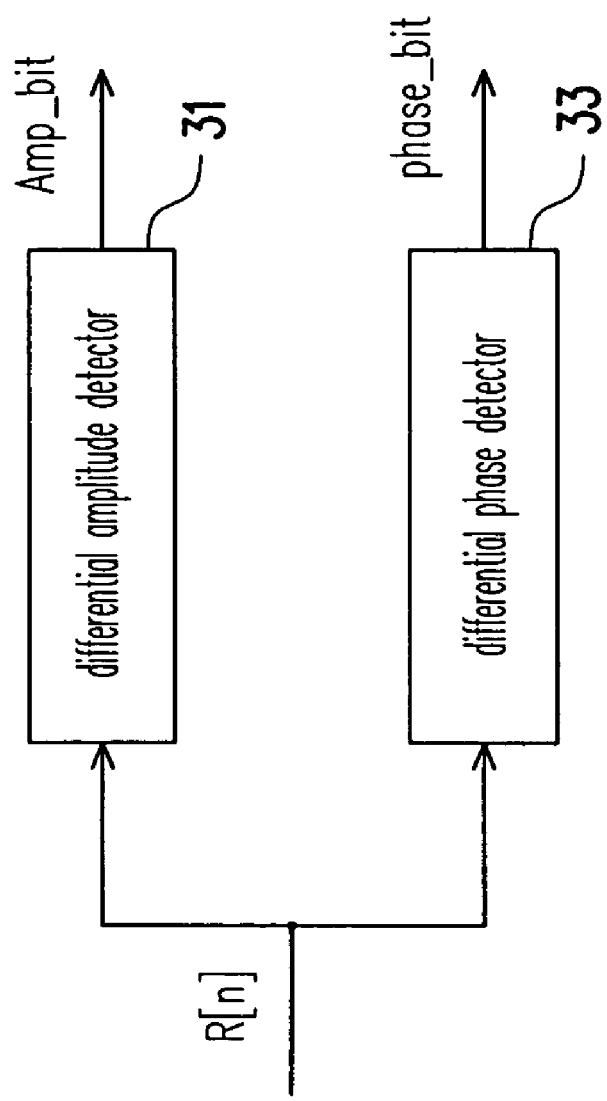
FIG. 3 is a block diagram of a demodulator according to yet another embodiment of the present invention.

FIG. 3 is a block diagram showing a demodulator applying a D-APSK demodulation according to yet another preferred embodiment of the present invention. The demodulator includes a differential amplitude detector 31 and a differential phase detector 33. The differential amplitude detector 31 can be implemented using the structures shown in FIG. 1. There is no particular limitation to the structure of the differential phase detector 33. By the detectors 31 and 33, the amplitude bit amp_bit and the phase bit phase_bit can be demodulated independently.

In summary, according to the proposed two-level D-ASK signal demodulation method and structure in the preferred embodiments of the present invention, bits of the transmission information signal can be determined through comparing the amplitude difference between the consecutive input signals with a threshold value. Moreover, the threshold value is dynamically adjusted according to the amplitude of the input signal.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A two-level differential amplitude-shift-keying (D-ASK) signal demodulator for demodulating an amplitude bit of an input signal, comprising:
   a first envelope detector for detecting an amplitude of the input signal and providing an amplitude signal of the input signal;
   a first delay unit for delaying the amplitude signal of the input signal to generate a delayed amplitude signal;
   a first subtractor for subtracting the delayed amplitude signal from the amplitude signal of the input signal;
   a second envelope detector for detecting an amplitude signal of an output signal from the first subtractor;
   a threshold value generator for receiving the amplitude signal of the input signal and generating a threshold value dynamically according to the input signal and a previously generated threshold value; and
   a comparator for comparing the output of the second envelope detector with the threshold value produced by the threshold value generator, determining if there is any change between the amplitude of the consecutive input signals, and outputting a comparison result as the amplitude bit of the input signal.

2. The two-level D-ASK signal demodulator of claim 1, wherein the threshold value generator further includes:
   a first bit shifter for receiving the amplitude signal of the input signal and performing a first bit shift on the amplitude signal of the input signal;
   a second subtractor;
   a second bit shifter for receiving an output from the second subtractor and performing a second bit shifting on the output from the second subtractor;
   an adder for generating the threshold value; and
   a second delay unit for delaying the threshold value provided by the adder to produce a delayed threshold value;
   wherein the second subtractor subtracts the delayed threshold value produced by the second delay unit from the output of the first bit shifter and outputs a subtraction result to the second bit shifter, and the adder adds the delayed threshold value and the output from the second bit shifter to produce the threshold value.

3. The two-level D-ASK signal demodulator of claim 1, wherein the output signal from the first delay signal represents the amplitude signal of a previous input signal.

4. The two-level D-ASK signal demodulator of claim 1, wherein the output from the first subtractor represents the amplitude difference between the consecutive input signals.

5. The two-level D-ASK signal demodulator of claim 1, wherein the input signal is generated from adding channel effect to a two-level differential amplitude-shift-keying signal.

6. The two-level D-ASK signal demodulator of claim 5, wherein the amplitude signal of the input signal is approximately equal to a product of an amplitude value of the two-level D-ASK signal and a channel strength.

7. The two-level D-ASK signal demodulator of claim 1, wherein the output result from the second envelope detector is an absolute value of the output from the first subtractor.

8. A method of demodulating a two-level differential amplitude-shift-keying (D-ASK) signal, comprising:
   receiving an input signal generated from adding a channel effect to a two-level D-ASK signal;
   using a first detector for detecting an amplitude of the input signal to generate an amplitude signal;
   using a delay unit for delaying the amplitude signal to generate a delayed amplitude signal;
   using a threshold value generator for dynamically generating a threshold value according to the amplitude signal and a previously generated threshold value, wherein the threshold value responds to the channel effect;
   using a subtractor for obtaining a difference value between the amplitude signal and the delayed amplitude signal;
   using a second detector for detecting an amplitude of the difference value; and
   using a comparator for comparing the amplitude of the difference value with the threshold value,
   wherein the comparison result is used to determine an amplitude bit of the input signal.

9. The demodulating method of claim 8, wherein the amplitude signal of the input signal is approximately equal to a product of an amplitude value of the two-level D-ASK signal and a channel strength.

10. The demodulating method of claim 8, wherein the step of dynamically generating the threshold value includes:
    performing a first bit shift on the amplitude signal to generate a first shifted amplitude signal;
    subtracting a delayed threshold value from the first shifted amplitude signal to produce a subtraction result;
    performing a second bit shift on the subtraction result to produce a second shifted amplitude signal;
    adding the delayed threshold value to the second shifted amplitude signal to produce the threshold value;
    wherein the delayed threshold value is produced by delaying the threshold value.

11. The demodulating method of claim 8, wherein the step of obtaining the difference value includes subtracting the delayed amplitude signal from the amplitude signal.

12. The demodulating method of claim 8, wherein the amplitude of the difference value is an absolute value of the difference value.

13. The demodulating method of claim 8, wherein the input signal includes an amplitude bit and the comparison result is used to determine the amplitude bit of the input signal.

* * * * *